US006873159B2

(12) United States Patent
Koch

(10) Patent No.: US 6,873,159 B2
(45) Date of Patent: Mar. 29, 2005

(54) DEVICE AND METHOD FOR MONITORING A CAPACITOR BUSHING

(75) Inventor: Norbert Koch, Cologne (DE)

(73) Assignee: Siemens Aktiengesellschaft, Munich (DE)

( * ) Notice: Subject to any disclaimer, the term of this patent is extended or adjusted under 35 U.S.C. 154(b) by 115 days.

(21) Appl. No.: 10/221,269

(22) PCT Filed: Mar. 6, 2001

(86) PCT No.: PCT/DE01/00936

§ 371 (c)(1),
(2), (4) Date: Dec. 30, 2002

(87) PCT Pub. No.: WO01/69272

PCT Pub. Date: Sep. 20, 2001

(65) Prior Publication Data

US 2003/0184325 A1 Oct. 2, 2003

(30) Foreign Application Priority Data

Mar. 14, 2000 (DE) .......................................... 100 12 068
Jul. 24, 2000 (DE) .......................................... 100 37 432

(51) Int. Cl.⁷ .............................................. G01R 31/08
(52) U.S. Cl. ........................ 324/519; 324/551; 324/552
(58) Field of Search ................................ 324/551, 552, 324/519

(56) References Cited

U.S. PATENT DOCUMENTS

| 3,710,242 A | 1/1973 | Povey |
| 4,437,134 A | 3/1984 | Dupraz |
| 5,640,154 A | 6/1997 | Meyer et al. |

FOREIGN PATENT DOCUMENTS

| DE | 21 33 809 C2 | 1/1972 |
| DE | 26 34 595 A1 | 3/1977 |
| DE | 28 46 285 C2 | 4/1979 |
| DE | 220 704 A1 | 4/1985 |
| DE | 36 01 934 C2 | 7/1987 |
| EP | 0 351 559 B1 | 1/1990 |
| EP | 0 829 015 B1 | 11/1996 |
| GB | 2 007 048 A | 5/1979 |

*Primary Examiner*—Charles H. Nolan, Jr.
(74) *Attorney, Agent, or Firm*—Morrison & Foerster LLP

(57) ABSTRACT

The invention relates to a method for monitoring a capacitor bushing (1) to which an electrical operating voltage (UB) is applied and in which a voltage divider is formed with an electrically conductive insert (4), whereby at least one measured value (UM1) of an electrical measured quantity (UM) is recorded and stored by using a measuring tap (7), which is connected to the insert (4), and by using each potential. The aim of the invention is to improve the method so that it is only slightly influenced by changes in the operating voltage. To this end, the impedance (ZE) between the measuring tap (7) and the earth potential is modified after recording the at least one measured value (UM1), and at least one signal value (US1) of a measurement signal (US) subsequently formed is recorded and stored using the measuring tap (7) and the earth potential. The temporal interval between the time of recording of the measured value (UM1) and the time of recording of the signal value (US1) is measured in such a manner that a change in the operating voltage (UB), which potentially occurs between both times, is negligible. The invention also relates to a device for monitoring a capacitor bushing.

13 Claims, 1 Drawing Sheet

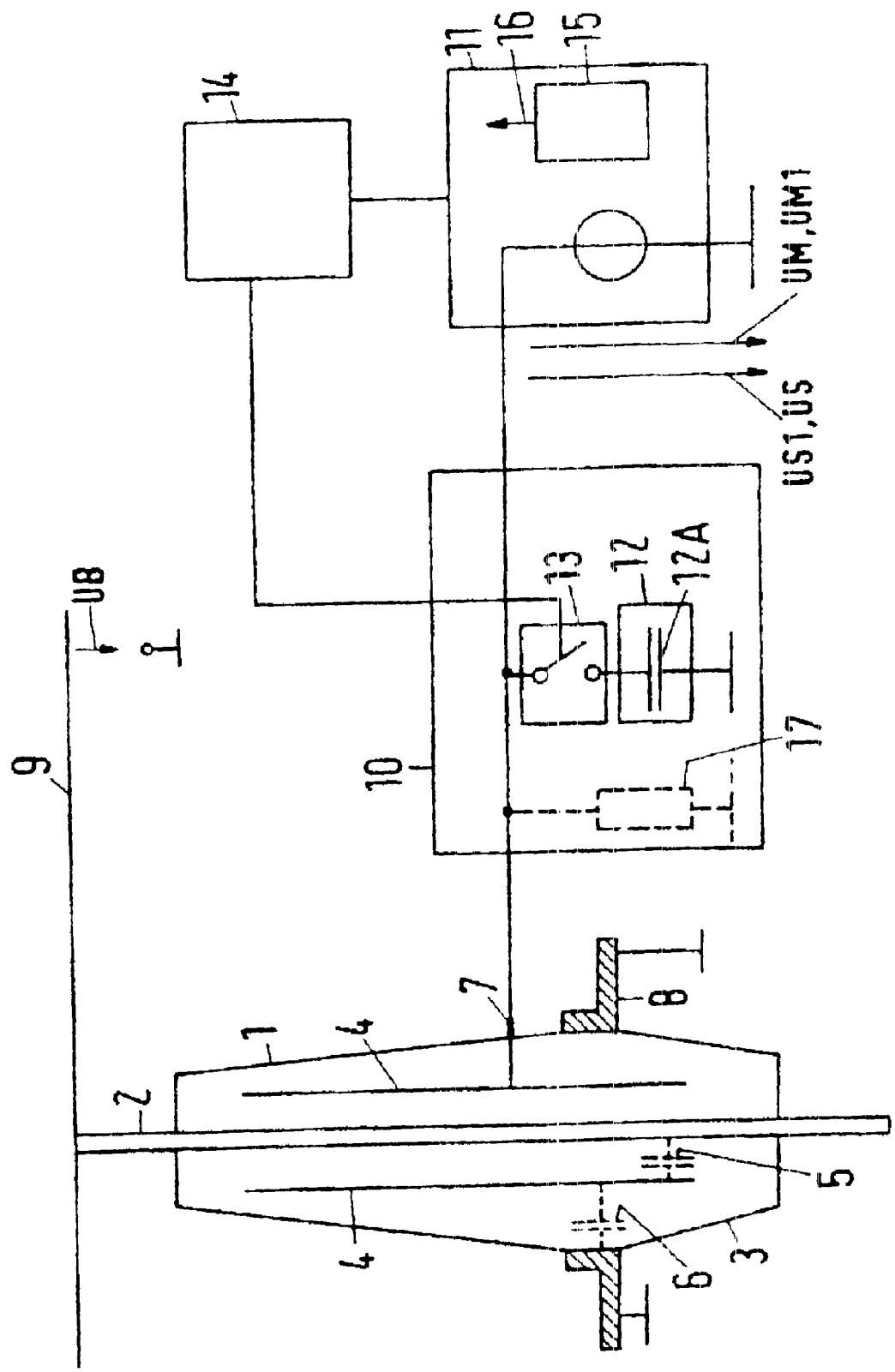

DEVICE AND METHOD FOR MONITORING A CAPACITOR BUSHING

CLAIM FOR PRIORITY

This application claims priority to International Application No. PCT/DE01/00936 which was filed in the German language on Mar. 6, 2001.

TECHNICAL FIELD OF THE INVENTION

The invention relates to a device and method for monitoring a capacitor bushing, and in particular, to a capacitor bushing to which an electrical operating voltage is applied and in which a voltage divider is formed with an electrically conducting insert.

BACKGROUND OF THE INVENTION

EP 0 829 015 B1 discloses recording dangerous changes in the dielectric strength of insulation. In this case, only the partial voltage of a capacitive divider present between the measuring tap and ground potential is recorded as the electrical measured quantity and monitored for a change in the partial voltage. Obviously, a number of measured values, for example the amplitude of the partial voltage respectively at successive points in time, are recorded and stored. The temporal interval between two successive detected changes in the partial voltage is ascertained and the frequency of the changes occurring per unit of time is used as a basis for concluding the insulating state of the capacitor bushing. The point in time of a change must be recorded as accurately as possible. This requires great measurement effort, since the measured values must be ascertained at temporally very short intervals. Additionally, the deviation of the operating voltage from a nominal value has an effect on the accuracy of the evaluation, since a deviation of the operating voltage from its nominal value also has the consequence of a deviation of the corresponding partial voltage. This is disadvantageous in particular during a sustained change in the operating voltage.

SUMMARY OF THE INVENTION

The invention discloses a method that is influenced comparatively less by a change in the operating voltage.

One embodiment of the invention provides that the impedance between the measuring tap and the ground potential is changed after recording after recording the at least one measured value, and at least one signal value of a measurement signal then forming is recorded and stored using the measuring tap and the ground potential, the temporal interval between the point in time of recording the one measured value and the point in time of recording the one signal value being set such that possible changes in the operating voltage between the two points in time are negligible; on the basis of the measured value and the signal value, quotient formation is used to ascertain a characteristic quantity, which is compared with a predetermined set value and, if the characteristic quantity deviates from the predetermined set value, a status signal indicating a fault of the capacitor bushing is formed.

In one aspect of the invention, the characteristic quantity ascertained by quotient formation is virtually independent of the level of the operating voltage and also of fluctuations in the operating voltage. It is therefore not necessary to know the exact value of the operating voltage. Rather, it is important that the operating voltage has virtually the same value at both points in time—that is at the point in time of ascertaining the measured value and at the point in time of ascertaining the signal value. Therefore, the characteristic quantity can be advantageously ascertained and used for an assessment of the insulation of the capacitor bushing even in the case of an operating voltage deviating from its nominal value. The characteristic quantity which was ascertained for the still undamaged or uninfluenced capacitor bushing or else a characteristic quantity estimated or calculated for this capacitor bushing may be used here as the set value.

In another embodiment of the invention, the impedance between the measuring tap and the ground potential is changed after recording the at least one measured value, and at least one signal value of a measurement signal then forming is recorded and stored using the measuring tap and the ground potential, the temporal interval between the point in time of recording the one measured value and the point in time of recording the one signal value being set such that possible changes in the operating voltage between the two points in time are negligible; on the basis of the voltage divider equation respectively applying for the measured value and for the signal value, the signal value, the measured value, the unchanged impedance and the changed impedance are used to ascertain the impedance between the insert and the conductor of the capacitor bushing to which the operating voltage is applied; this impedance is compared with a predetermined set value and, if the impedance deviates from the predetermined set value, a status signal indicating a fault of the capacitor bushing is formed.

In one aspect, the impedance between the insert and the conductor of the capacitor bushing to which the operating voltage is applied is likewise a quantity which is independent of the level of the operating voltage and on the basis of which the insulating state of the capacitor bushing can be concluded. In this case, the corresponding impedance in the case of a still undamaged or unchanged capacitor bushing serves as the set value.

In another aspect, the changing of the impedance between the measuring tap and the ground potential is preferably carried out when the measured quantity, or the measurement signal, is as low as possible. As a result, the changing of the impedance took place, so that loading of a switching device required is caused by a measuring current as low as possible.

In a preferred embodiment, the measured value is recorded in a first half-period of the operating voltage and the signal value is recorded in the subsequent second half-period of the operating voltage. As a result, the measured value and the signal value are recorded at a very short temporal interval, so that a fluctuation in the operating voltage has largely no influence on the monitoring.

Preferably, a number of characteristic quantities are ascertained one after the other and an average value of the characteristic quantity is formed. The average value of the characteristic quantity may then be used additionally for comparison with the set value, the average value of the characteristic quantity advantageously being virtually entirely independent of a fluctuation in the operating voltage.

The impedance lying between the measuring tap and the ground potential is preferably changed by connecting in or disconnecting a known fixed impedance. This is a simple way of changing the impedance between the measuring tap and the ground potential.

In another embodiment of the invention, there is a device for monitoring a capacitor bushing to which an electrical operating voltage is applied, in which a voltage divider is formed with an electrically conducting insert, a measuring tap connected to the insert being provided and connected to a measuring device for recording an electrical measured quantity.

Such a device is also known from EP 0 829 015 B1, already cited above. The known device is merely connected to the measuring tap of the capacitor bushing by means of a lead. The partial voltage applied to the measuring tap at ground potential is used as the electrical measured quantity.

In one embodiment of the invention, the device has a capacitor bushing that can be monitored largely uninfluenced by fluctuations in the operating voltage.

In one aspect according to the invention, by the impedance present between the measuring tap and ground potential includes an impedance arrangement which is assigned a switching device.

In another embodiment, a control device is preferably provided for activating the switching device. With the aid of the control device, the switching device can be automatically activated, so that the impedance can be automatically changed.

In another preferred embodiment, the measuring device has a quotient former. With the quotient former, the quotient can be advantageously formed from a measured value ascertained with the impedance unchanged and a signal value ascertained with the impedance changed. This quotient can then be used as a characteristic quantity for the state of the capacitor bushing.

In still another preferred embodiment, the impedance arrangement includes a capacitor, which on the one hand is connected to ground potential and on the other hand is connected via the switching device to the measuring tap. The capacitor can be connected to the measuring tap and disconnected from it by means of the switching device.

In yet another preferred embodiment, the impedance arrangement has another further fixed impedance, which is connected between the measuring tap and the ground potential. The further fixed impedance may be chosen such that the divider ratio of the voltage divider is influenced in such a way that the measured quantity and the measurement signal are of orders of magnitude which can be measured well.

BRIEF DESCRIPTION OF THE DRAWINGS

The method and the device are explained on the basis of the drawings, in which:

FIG. 1 shows a capacitor bushing with a central conductor.

FIG. 1 is a capacitor bushing 1 with a central conductor 2, for example a high-voltage conductor, which is surrounded by an insulator 3. Arranged on the insulator 3 is a metallic flange 8 for securing the capacitor bushing in a housing wall (not represented). Fixed in the insulator 3 is a conducting insert 4, which is electrically insulated from the electrical conductor 2 and surrounds the latter. The capacitor bushing 1 may also have a number of such inserts. However, only one insert 4 is represented for clarity. This is connected in an electrically conducting manner to a measuring tap 7. The conductor 2 is connected to a high-voltage line 9, to which an operating voltage UB is applied. The flange 8 is at ground potential. The measuring tap 7 is connected via an impedance arrangement 10 to a measuring device 11. The impedance arrangement 10 has a fixed impedance 12, which can be connected to the measuring tap 7 and can be disconnected from the measuring tap 7 via a switching device 13. The switching device 13 is connected to a control device 14. The switching device 13 may be configured for example with a semiconductor switch. The fixed impedance 12 is configured here by way of example as a capacitor 12A. The impedance arrangement 10, the measuring device 11 and the control device 14 form a device 18 for monitoring the capacitor bushing 1.

The conducting insert 4 forms a voltage divider. The one impedance of the voltage divider is formed by the impedance ZH, which lies between the conducting insert 4 and the conductor 2 and substantially comprises a capacitance 5 (represented by dashed lines). The other impedance of the voltage divider is formed by the impedance ZE, which lies between the conducting insert 4 and the ground potential. This impedance ZE comprises the capacitance 6 (represented by dashed lines) lying within the capacitor bushing 1 between the insert 4 and the ground potential, the impedance arrangement 10 parallel to said capacitance and the internal resistance (not represented in any more detail) of the measuring device 11.

The capacitor bushing 1 is monitored for a fault by the device 18. A fault may be a change in the capacitance 5. Generally, the capacitance 5 is increased by such a fault. An increase in the capacitance 5 is synonymous with a reduction in the insulation resistance between the conductor 2 and the insert 5.

For monitoring the capacitor bushing 1, the impedance arrangement 10 is initially in a first measuring state, in which the switching arrangement 13 is open and the fixed impedance 12 is not connected to the measuring tap. In this first measuring state, a measured value UM1 of an electrical measured quantity UM is recorded at a first point in time $t_1$ and stored in a memory (not represented in any more detail) in the measuring device 11. This measured quantity UM is in this case the electrical voltage applied to the measuring tap at ground potential. In this measuring state of the impedance arrangement 10, the impedance ZE is formed by the parallel connection of the capacitance 6 and the internal resistance (not represented in any more detail) of the measuring device 11. The impedance in this measuring state is referred to as unchanged impedance ZE1.

After recording the measured quantity UM1, the impedance arrangement 10 is put into a second measuring state. For this purpose, the control device 14 is put into the closed state under the control of the switching device 13. As a result, the fixed impedance 12 is now connected in an electrically conducting manner to the measuring tap 7. The impedance ZE is now formed by the parallel connection of the capacitance 6, the internal resistance (not represented in any more detail) of the measuring device 11 and the fixed impedance 12. In this second measuring state, a signal value US1 of a measurement signal US then forming is recorded by the measuring device 11 at a second point in time $t_2$ and likewise stored. The measurement signal US is the electrical voltage applied to the measuring tap at ground potential. The impedance ZE in this second measuring state is referred to as changed impedance ZE2.

The temporal interval between the point in time t, and the point in time $t_2$ is chosen such that a possibly occurring change in the operating voltage UB between the two points in time $t_1$ and $t_2$ is negligible. This may for example take place so quickly that the change in the operating voltage is negligible on account of its own periodicity (with the system frequency). It can then be assumed that the amplitude of the operating voltage UB has remained constant between the two points in time $t_1$ and $t_2$.

For the measured value UM1, the following voltage divider equation G1 applies:

$$\frac{UM1}{UB} = \frac{ZE1}{ZE1+ZH} \quad (G1)$$

For the signal value US1, the following voltage divider equation G2 applies:

$$\frac{US1}{UB} = \frac{ZE2}{ZE2+ZH}. \quad (G2)$$

Since, as already explained above, it can be presupposed that the operating voltage UB has remained constant, the operating voltage UB can be eliminated by equating the correspondingly transformed equations G1 and G2, and the following equation G3 applies:

$$UM1\frac{ZE1+ZH}{ZE1} = US1\frac{ZE2+ZH}{ZE2} \quad (G3)$$

As mentioned above, when there is a fault of the capacitor bushing 1, the impedance ZH changes, and the capacitance 6 remains unchanged. Consequently, apart from the impedance ZH, the quantities in the equation G3 are known, or constant. A relationship for a characteristic quantity K which is solely dependent on the impedance ZH can be obtained from the equation G3. This characteristic quantity K is compared with a predetermined set value K0. If the characteristic quantity K deviates from the predetermined set value K0, a status signal 16 indicating a fault of the capacitor bushing 1 is formed. A characteristic quantity which has been ascertained by the method according to the invention in the case of an unchanged or undamaged capacitor bushing can be used as the set value K0. The characteristic quantity may, however, also be ascertained when the capacitor bushing 1 is put into operation or be determined by calculation.

The quotient of the measured value UM1 and the signal value US2 may be formed as a characteristic quantity Kl. For this purpose, a quotient former 15 provided in the measuring device 11 is used. A fault of the capacitor bushing 1, that is a change in the capacitance 5, has an effect on the divider ratio of the voltage divider and consequently on the measured quantity UM and the measurement signal US. However, the measured quantity UM and the measurement signal US change differently in percentage terms. On the other hand, when there is a change in the operating voltage UB, the measured quantity UM and the measurement signal US change identically in percentage terms. The different change in percentage terms of the measured quantity UM and the measurement signal US with an unchanged capacitance 5 produces a different quotient with respect to the set value K0, and consequently a characteristic quantity K deviating from it. The level of the operating voltage UB, on the other hand, has virtually no effect on the quotient, and consequently on the characteristic quantity K. In particular, even the characteristic quantity K ascertained during a sustained deviation of the operating voltage UB from its nominal value can be used for a comparison with the set value K0. In this particular case it is not necessary to know the operating voltage UB exactly. Therefore, no great efforts have to be taken to record it. It is likewise not necessary for the point in time of a change to be recorded with any great precision or effort.

The capacitance 6 of the capacitor bushing 1, the internal resistance (not represented in any more detail) of the measuring device and the impedance module 12, and consequently the impedances ZE1 and ZE2, are generally known. With the impedances ZE1 and ZE2 and also the measured value UM1 and the signal value US1, it is possible with the aid of the equation G3 to calculate impedance ZH, or the capacitance 6, as the characteristic quantity KG. After that, the impedance ZH is obtained according to the following equation G4 as $$ZH = ZE1 \cdot ZE2 \frac{US1-UM1}{UM1 \cdot ZE2 - US1 \cdot ZE1}. \quad (G4)$$

A particularly simple case is obtained if the impedances ZE1, ZE2 and ZH can in each case be considered as pure capacitances. Then the measured value UM1 and the signal value US1 merely have to be ascertained in terms of their amount, but not their phase. As a result, a particularly simple calculation of the characteristic quantity K or KC is obtained.

To set the orders of magnitude of the measured quantity UM and of the measurement signal US respectively to an order of magnitude which is well suited for measurement, the impedance arrangement 10 may have a further fixed impedance 17 (represented by dashed lines). By corresponding choice of the value of the further fixed impedance 17, the divider ratio of the voltage divider is correspondingly influenced. The fixed impedance 17 may be chosen for example as the capacitance. The fixed impedance 17 is then taken into account in the above equations in the impedances ZE1 and ZE2.

Since the operating voltage UB is generally periodic, the measured quantity UM and the measurement signal US are also periodic. The changing of the impedance ZE takes place when the measured quantity UM or the measurement signal US are low. This is the case in the proximity of a zero crossing of the measured quantity UM or the measurement signal US. As a result, the switching device 13 is switched in a largely unloaded state. The maximum value of the measured quantity UM in a first half-period of the operating voltage UB can be recorded as measured value UM1 and the maximum value of the measurement signal US in the subsequent second half-period of the operating voltage UB can be recorded as signal value US1. It is also possible to record in a measuring state a number of maximum values and use them to determine an averaged maximum value, which is used for the actual calculation of the characteristic quantity. The averaging allows noise influences to be reduced.

With the measuring device 11 and the control device 14 it is also possible for a number of characteristic quantities to be ascertained one after the other and by corresponding control of the impedance arrangement 10. The measuring device 11 may include an average-value former (not represented in any more detail), with which an average value MK of these characteristic quantities is formed. The average value MK has a very low dependence on fluctuations in the operating voltage UB.

The current between the measuring tap 7 and the impedance arrangement 10, obtained in the first measuring state or the second measuring state, may also be used as the measured quantity UM or as the measurement signal US.

What is claimed is:

1. A method for monitoring a capacitor bushing to which an electrical operating voltage is applied and in which a voltage divider is formed with an electrically conducting insert, comprising:

recording and storing at least one measured value of an electrical measured quantity by using a measuring tap, which is connected to the insert, and by using ground potential;

changing the impedance between the measuring tap sand the ground potential after recording the at least one measured value;

recording and storing at least one signal value of a measurement signal formed using the measuring tap and the ground potential;

setting the temporal interval between the point in time of recording the one measured value and the point in time of recording the one signal value such that changes in the operating voltage between the two points in time are negligible, wherein based on the measured value and the signal value, quotient formation is used to ascertain a characteristic quantity, which is compared with a predetermined set value, and;

if the characteristic quantity deviates from the predetermined set value, a status signal indicating a fault of the capacitor bushing is formed.

2. A method for monitoring a capacitor bushing to which an electrical operating voltage is applied and in which a voltage divider is formed with an electrically conducting insert comprising:

recording and storing at least one measured value of an electrical measured quantity by using a measuring tap, which is connected to the insert, and by using ground potential;

the impedance between the measuring tap and the ground potential after recording the at least one measured value;

recording and storing at least one signal value of a measurement signal formed using the measuring tap and the ground potential; and setting the temporal interval between the point in time of recording the one measured value and the point in time of recording the one signal value being set such that possible changes in the operating voltage between the two points in time are negligible, wherein based on the voltage divider equation respectively applying for the measured value for the signal value, the signal value, the measured value, the unchanged impedance sand the changed impedance rare used to ascertain the impedance between the insert and the conductor of the capacitor bushing to which the operating voltage is applied, which impedance is compared with a predetermined set value, and if the impedance deviates from the predetermined set value, a status signal indicating a fault of the capacitor bushing is formed.

3. The method as claimed in claim 1, wherein the changing of the impedance between the measuring tap and the ground potential is carried out when the measured quantity, or the measurement signal, is as low as possible.

4. The method as claimed in claim 3, wherein the measured value is recorded in a first half-period of the operating voltage and the signal value is recorded in the subsequent second half-period of the operating voltage.

5. The method as claimed in claim 1, wherein a number of characteristic quantities are ascertained one after the other and an average value of the characteristic quantity is formed.

6. The method as claimed in claim 1 wherein the impedance lying between the measuring tap and the ground potential is changed by connecting in or disconnecting a known fixed impedance.

7. A device for monitoring a capacitor bushing to which an electrical operating voltage is applied, in comprising:

a voltage divider formed with an electrically conducting insert;

a measuring tap connected to the insert being provided and connected to a measuring device to record an electrical measured quantity; wherein the impedance present between the measuring tap and ground potential includes an impedance arrangement which is assigned a switching device, and the measuring device has a quotient former and is connected to a control device provided for activating the switching device.

8. The device as claimed in claim 7, wherein the impedance arrangement includes a capacitor, which on the one hand is connected to ground potential and on the other hand is connected via the switching device to the measuring tap.

9. The device as claimed in claim 7, characterized in that the impedance arrangement has a further fixed impedance, which is connected between the measuring tap and the ground potential.

10. The method as claimed in claim 2, wherein the changing of the impedance between the measuring tap and the ground potential is carried out when the measured quantity, or the measurement signal, is as low as possible.

11. The method as claimed in claim 10, wherein the measured value is recorded in a first half-period of the operating voltage and the signal value is recorded in the subsequent second half-period of the operating voltage.

12. The method as claimed in claim 2, wherein a number of characteristic quantities are ascertained one after the other and an average value of the characteristic quantity is formed.

13. The method as claimed in claim 2, wherein the impedance lying between the measuring tap and the ground potential is changed by connecting in or disconnecting a known fixed impedance.

* * * * *